United States Patent
Leland et al.

(10) Patent No.: US 9,678,116 B2
(45) Date of Patent: *Jun. 13, 2017

(54) TRIAC LOW VOLTAGE DIMMING CONTROL SYSTEM

(71) Applicant: Inspired LED, LLC, Tempe, AZ (US)

(72) Inventors: Tanner J. Leland, Tempe, AZ (US); James J. Levante, Tempe, AZ (US); Randy J. Wright, Chandler, AZ (US)

(73) Assignee: Inspired LED, LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/068,838

(22) Filed: Mar. 14, 2016

(65) Prior Publication Data

US 2016/0195572 A1 Jul. 7, 2016

Related U.S. Application Data

(63) Continuation of application No. 14/484,656, filed on Sep. 12, 2014, now Pat. No. 9,288,851.

(51) Int. Cl.
| | |
|---|---|
| *H05B 41/36* | (2006.01) |
| *G01R 19/00* | (2006.01) |
| *H05B 33/08* | (2006.01) |
| *H05B 39/08* | (2006.01) |

(52) U.S. Cl.
CPC ..... *G01R 19/0084* (2013.01); *H05B 33/0809* (2013.01); *H05B 33/0815* (2013.01); *H05B 33/0845* (2013.01); *H05B 33/0887* (2013.01); *H05B 39/08* (2013.01)

(58) Field of Classification Search
USPC ... 315/186, 193, 209 R, 219, 224, 225, 226, 315/291, 297, 307, 311, 313, 36, 2, 315/DIG. 4
See application file for complete search history.

(56) References Cited

U.S. PATENT DOCUMENTS

| | | | |
|---|---|---|---|
| 3,353,083 | A | 11/1967 | Greenberg |
| 7,180,250 | B1 | 2/2007 | Gannon |
| 2011/0127925 | A1 | 6/2011 | Huang |
| 2013/0049631 | A1 | 2/2013 | Riesebosch |
| 2013/0154487 | A1 | 6/2013 | Kuang |

OTHER PUBLICATIONS http://inspiredled.com/image/data/products/pdfs/Wireless%20Dimmer%205.15.13.pdf; RF Wireless LED Dimmer from Inspired LED; Received and Printed Sep. 5, 2014.

(Continued)

*Primary Examiner* — Douglas W Owens
*Assistant Examiner* — Jianzi Chen
(74) *Attorney, Agent, or Firm* — Neustel Law Offices

(57) ABSTRACT

A TRIAC low voltage dimming control system for effectively controlling the dimming of low voltage lighting using a TRIAC dimmer. The TRIAC low voltage dimming control system generally includes a TRIAC analyzer that applies a test voltage to a TRIAC dimmer and measures the amount of time required for the TRIAC dimmer to conduct electricity. Utilizing the measured time for the TRIAC dimmer to conduct electricity, the TRIAC analyzer is able to calculate an approximate state of the TRIAC dimmer and provide a corresponding level of DC electrical power to a DC load.

20 Claims, 11 Drawing Sheets

(56) References Cited

OTHER PUBLICATIONS http://inspiredled.com/image/data/products/pdfs/4821.pdf; 4 Position Dimmer for LED Light Panels from Inspired LED; Received and Printed Sep. 5, 2014.
http://inspiredled.com/image/data/products/pdfs/DVLV-600P%20Dimmer_%20ALL%20COLORS.pdf; Lutron DVLV 600P; Received and Printed Sep. 5, 2014.
http://inspiredled.com/image/data/products/pdfs/DimmableTransformerSpec04%20_18_13.pdf; Dimmable LED Magnetic Transformers from Inspired LED; Received and Printed Sep. 5, 2014.
http://www.lutron.com/en-US/resourcelibrary/362219.pdf; Lutron Product Guide; Received and Printed Sep. 5, 2014.
Leviton Universal Dimmers; SureSlide Slide-to-Off and Table Top Universal Dimmer LED Compatibility Chart; Received and Printed Sep. 6, 2014.
Leviton Decora SureSlide Universal LED/CFL/Incandescent Dimmer; Product Specification; Received and Printed Sep. 6, 2014.

TRIAC LOW VOLTAGE DIMMING CONTROL SYSTEM

CROSS REFERENCE TO RELATED APPLICATIONS

I hereby claim benefit under Title 35, United States Code, Section 120 of U.S. patent application Ser. No. 14/484,656 filed Sep. 12, 2014. This application is a continuation of the Ser. No. 14/484,656 application. The Ser. No. 14/484,656 application is currently pending and will issue as U.S. Pat. No. 9,288,851 on Mar. 15, 2016. The Ser. No. 14/484,656 application is hereby incorporated by reference into this application.

STATEMENT REGARDING FEDERALLY SPONSORED RESEARCH OR DEVELOPMENT

Not applicable to this application.

BACKGROUND OF THE INVENTION

Field of the Invention

The present invention relates generally to a low voltage dimmer and more specifically it relates to a TRIAC low voltage dimming control system for effectively controlling the dimming of low voltage lighting using a TRIAC dimmer.

Description of the Related Art

Any discussion of the related art throughout the specification should in no way be considered as an admission that such related art is widely known or forms part of common general knowledge in the field.

Low voltage lighting has become increasingly popular in various applications such as but not limited to light-emitting diode (LED) based lighting, under cabinet lighting, TV back lighting, staircase lighting, architectural lighting, bar lighting, kitchen lighting, toe kick lighting, ceiling cove lighting, ceiling can lighting, troffer lighting, decorations, landscape lighting and vehicles. Most low voltage lighting utilizes low-voltage direct current (DC) electrical power that is less than 120V DC such as 12V DC, 24V DC or 48V DC.

LED based lighting has become an increasingly popular type of low voltage lighting because of the low power, low heat and color changing characteristics of LED lights. Examples of LED based lighting include LED light fixtures, LED light bulbs, LED light strips, flexible LED light strips, outdoor LED lighting, LED landscape lighting, recessed LED lighting, LED security lighting and LED flat panel lights. To illustrate one type of LED based lighting, a flexible LED light strip is comprised of an elongated flexible strip of printed circuit board (PCB) having two or more electrically conductive traces to provide electrical power, a plurality of light-emitting diodes attached along the front surface of the flexible strip and electrically connected to the conductive traces, and a length of adhesive along the back surface of the flexible strip.

Low voltage power supplies are used to convert high voltage alternating current (AC) electrical power (e.g. 120V AC, 240V AC) to low voltage direct current (DC) electrical power (e.g. 12V DC, 24V DC, 48V DC) to provide low voltage DC electrical power to various electrical devices such as low voltage lighting including LED lighting. Low voltage power supplies are often times referred to as "AC/DC power supplies", "switch-mode power supplies" or "magnetic low-voltage transformers". Low voltage power supplies are typically comprised of a magnetic transformer electrically connected in series with a rectifier to create a single-phase rectifier circuit that converts 120V AC to a low voltage (e.g. 12V DC). U.S. Pat. No. 3,353,083 (Greenberg) discloses an exemplary AC/DC power supply using a magnetic transformer and rectifier in series to convert AC electrical power to DC electrical power. Low voltage power supplies are used to provide electrical power to various types of low voltage lighting.

There are two main types of low voltage dimmers used to control light emitted from LED based lighting: Pulse-width modulation (PWM) LED dimmers and analog LED dimmers. PWM LED dimmers control the duty cycle of the low voltage power supplied to the LED based lighting thereby adjusting the luminosity of the LED lights. Analog LED dimmers provide variable current to the LED based lighting either through limiting the current or adjusting the applied voltage thereby changing the luminosity of the LED lights.

Conventional AC based light dimmers such as TRIAC (triode for alternating current) dimmers (a.k.a. TRIAC dimmer switches) are commonly utilized to dim AC high voltage lighting (e.g. incandescent or halogen lighting) which typically operate at 120V AC. TRIAC dimmers typically have a sliding dimmer switch (a.k.a. "slide dimmer"), rotating knob switch (a.k.a. "rotary dimmer") or a plurality of buttons to select a desired dimming level for lights. TRIAC dimmers may also have a power switch to allow for turning off or on the electrical power from the TRIAC dimmer regardless of the position of the dimmer control switch. TRIAC dimmers are widely available in stores and come in various colors, designs and configurations thereby allowing consumers to select from a wide variety of dimmer switch options.

Because a conventional TRIAC dimmer is designed to be only used with a pure resistive load (e.g. incandescent light bulb or halogen bulb), TRIAC dimmers are not suitable for use in combination with low voltage power supplies which are an inductive load. Hence, manufacturers and end users have been forced to utilize dimmers that are specifically designed for low voltage lighting.

Because of the inherent problems with the related art, there is a need for a new and improved TRIAC low voltage dimming control system for effectively controlling the dimming of low voltage lighting using a TRIAC dimmer.

BRIEF SUMMARY OF THE INVENTION

The invention generally relates to a low voltage dimmer which includes a TRIAC analyzer that applies a test voltage to a TRIAC dimmer and measures the amount of time required for the TRIAC dimmer to conduct electricity. Utilizing the measured time for the TRIAC dimmer to conduct electricity, the TRIAC analyzer is able to calculate an approximate state of the TRIAC dimmer and provide a corresponding level of DC electrical power to a DC load.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto. In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

Figure 1:
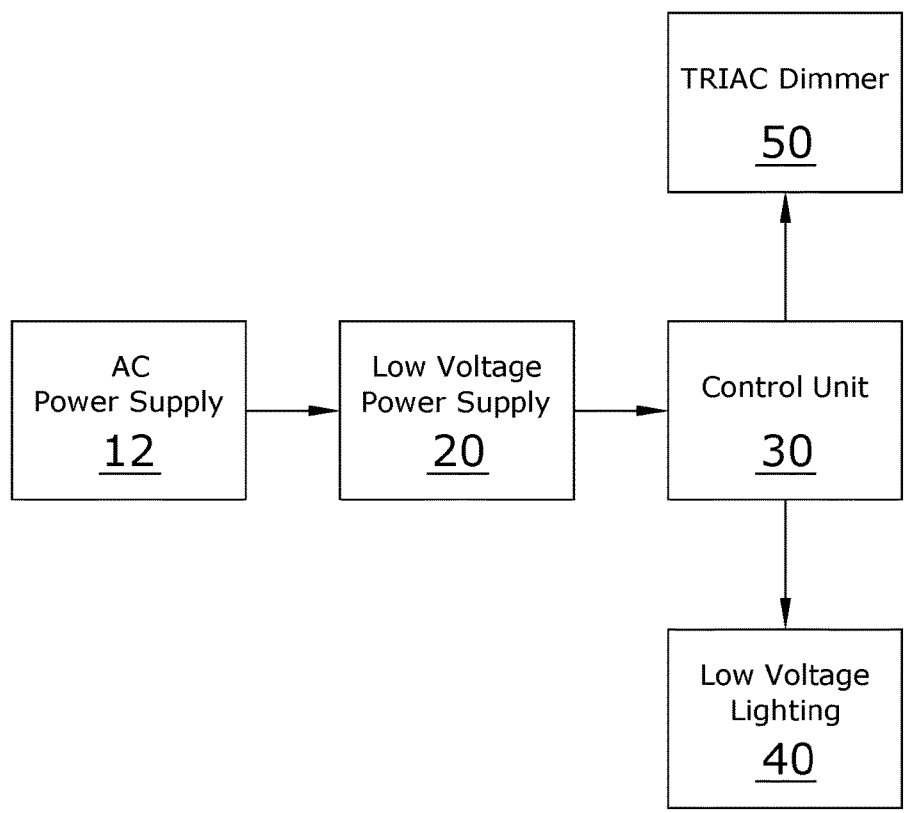
FIG. 1 is a block diagram illustrating the control unit in communication with a TRIAC dimmer to control low voltage lighting.

A. Overview.

Turning now descriptively to the drawings, in which similar reference characters denote similar elements throughout the several views, FIGS. 1 through 10 and 12 illustrate an electrical power control system to control DC electrical power provided to a DC load based upon a state (e.g. on or off, the brightness position) of a TRIAC dimmer 50. The DC based load may be comprised of various DC electrical devices such as but not limited to low voltage lighting 40, DC electrical motors and anything else that is powered by DC electrical power.

FIGS. 1 through 10 and 12 further illustrate a TRIAC low voltage dimming control system 10, which comprises a TRIAC analyzer 32 that applies a test voltage to a TRIAC dimmer 50 and measures the amount of time required for the TRIAC dimmer 50 to conduct electricity. Utilizing the measured time for the TRIAC dimmer 50 to conduct electricity, the TRIAC analyzer 32 is able to calculate an approximate state of the TRIAC dimmer 50 and provide a corresponding level of DC electrical power to a DC load.

B. Low Voltage Power Supply.

The low voltage power supply 20 may be comprised of any power supply that converts high voltage AC electrical power (e.g. 120V AC) from an AC power supply 12 to low voltage DC electrical power (e.g. 12V DC, 24V DC, 48V DC, etc.). The low voltage DC electrical power provided by the low voltage power supply 20 is less than 120V DC. The AC electrical power is provided via a conventional AC power supply 12 such as an electrical wall outlet or directly wiring into the power system of a building. U.S. Pat. No. 3,353,083 (Greenberg) discloses an exemplary AC/DC power supply using a magnetic transformer and rectifier in series to convert AC electrical power to DC electrical power and is hereby incorporated by reference herein to provide an exemplary low voltage power supply 20 suitable for use in the present invention.

C. Low Voltage Lighting.

The low voltage lighting 40 is comprised of any type of lighting that is electrically powered by low voltage DC electrical power that is less than 120V DC (e.g. 12V DC, 24V DC, 48V DC, etc.). The low voltage lighting 40 used in the present invention is preferably comprised of a light-emitting diode (LED) based lighting such as, but not limited to, an LED, LED light fixtures, LED light bulbs, LED light strips, flexible LED light strips, outdoor LED lighting, LED landscape lighting, recessed LED lighting, LED security lighting and LED flat panel lights.

Figure 2:
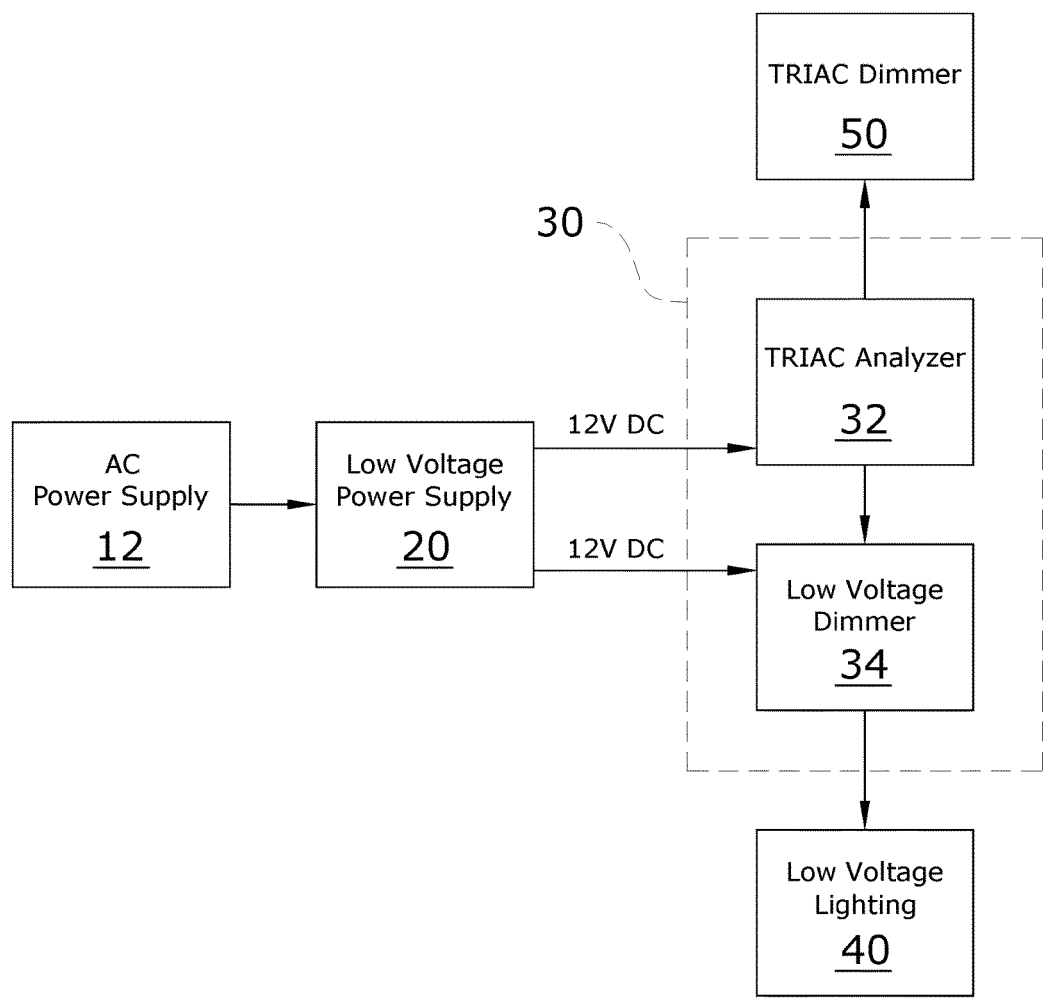
FIG. 2 is a block diagram illustrating the control unit comprised of a TRIAC analyzer and a low voltage dimmer.

As shown in FIGS. 1 and 2 of the drawings, the low voltage lighting 40 is electrically connected to the low voltage dimmer 34 wherein the low voltage dimmer 34 provides adjustable DC electrical power via a DC output voltage to the low voltage lighting 40 to adjust the level and amount of light emitted by the low voltage lighting 40.

D. TRIAC Dimmer.

The TRIAC dimmer 50 is comprised of a conventional TRIAC dimmer 50 switch that is in the thyristor family that is able to conduct electricity in both directions such as in AC applications (e.g. 120V AC applications). The TRIAC dimmer 50 is preferably comprised of a wall mounted dimmer switch but may be comprised of non-wall mounted dimmer switches.

Figure 7:
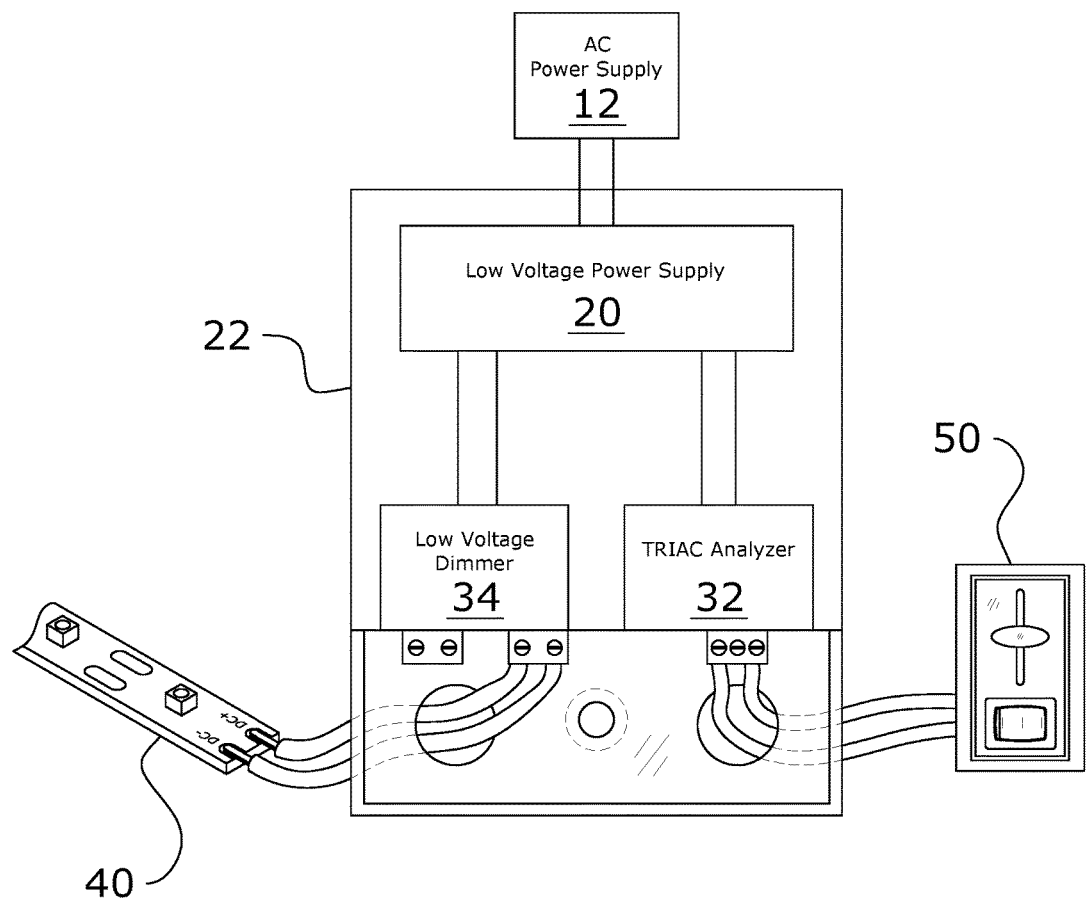
FIG. 7 is a diagram illustrating the present invention embodied directly and integrally formed within a housing of a low voltage power supply.
Figure 8:
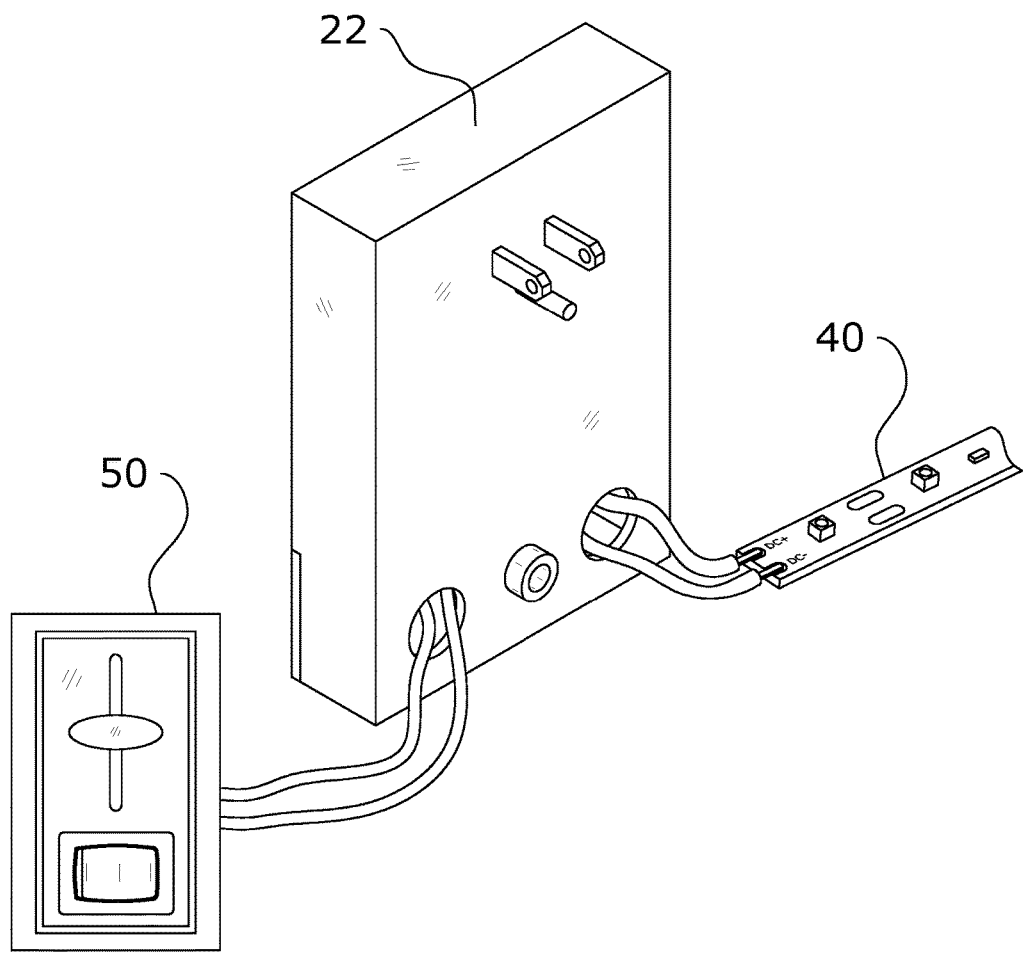
FIG. 8 is a rear upper perspective view of an exemplary housing for the low voltage power supply.

A conventional TRIAC dimmer 50 is typically utilized to control the luminosity of AC lighting (e.g. incandescent or halogen lighting). The term "TRIAC" is often times referred to as "triode for alternating current". The TRIAC dimmer 50 may be comprised of various types of conventional TRIAC dimmers 50 such as slide dimmers, rotatory dimmers and button controlled dimmers. The TRIAC dimmer 50 may also include a power switch that turns on or off the electrical power in addition to the adjustable control switch that controls the level of electrical power to the lights. FIGS. 7 and 8 illustrate an exemplary TRIAC dimmer 50 comprised of a slide dimmer configuration having a sliding control switch and a power switch below the sliding control switch.

Figure 5:
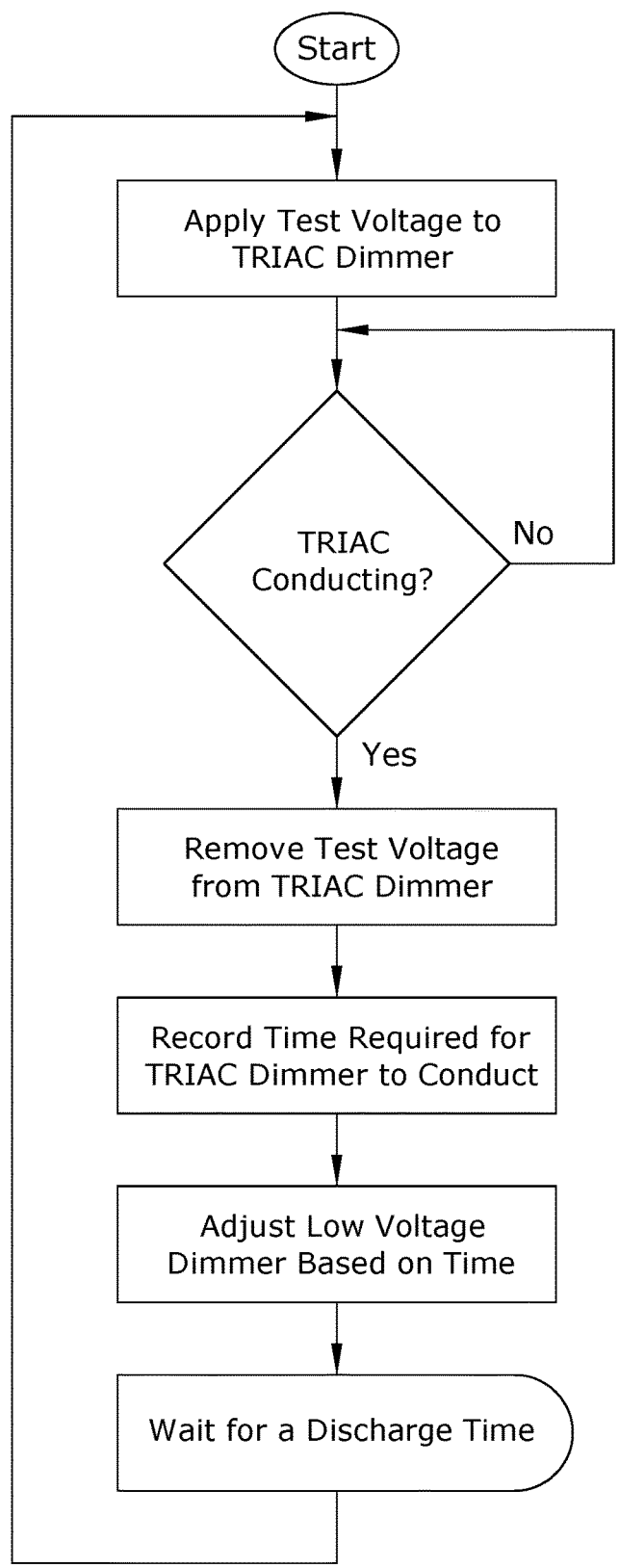
FIG. 5 is a flowchart illustrating the overall functionality of the TRIAC analyzer.
Figure 6:
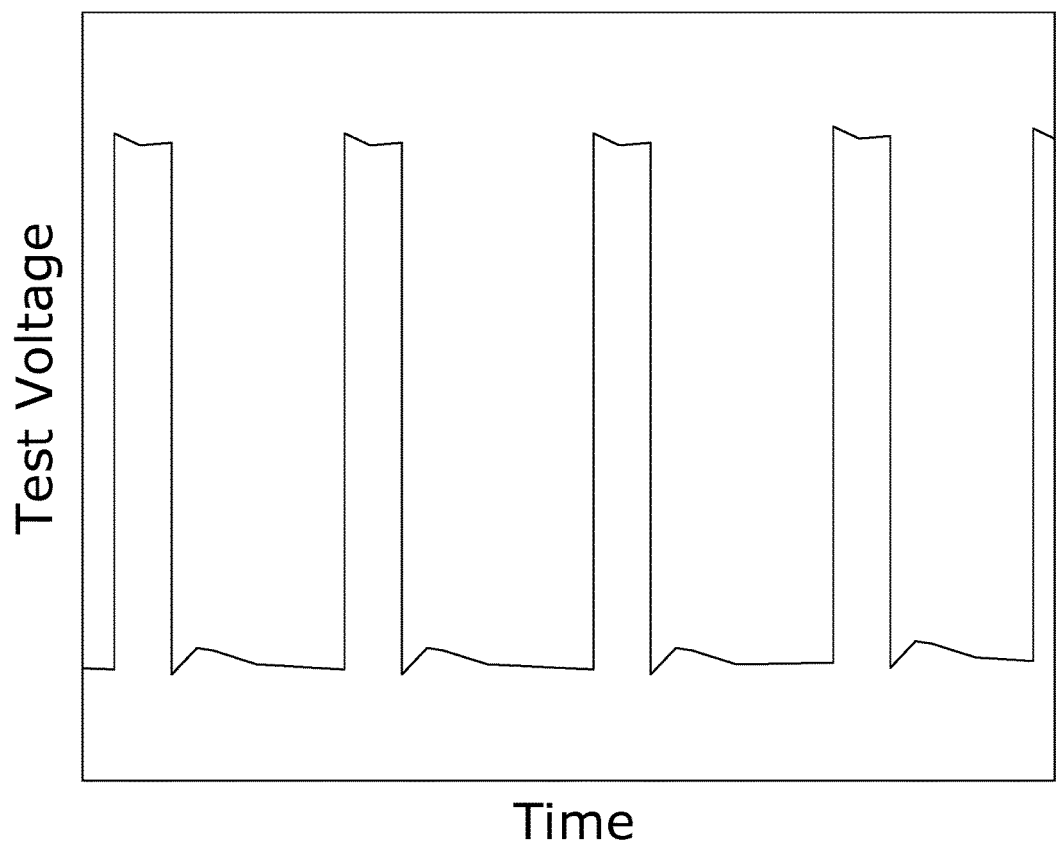
FIG. 6 is a chart illustrating an example of the test voltage applied to the TRIAC dimmer.
Figure 11:
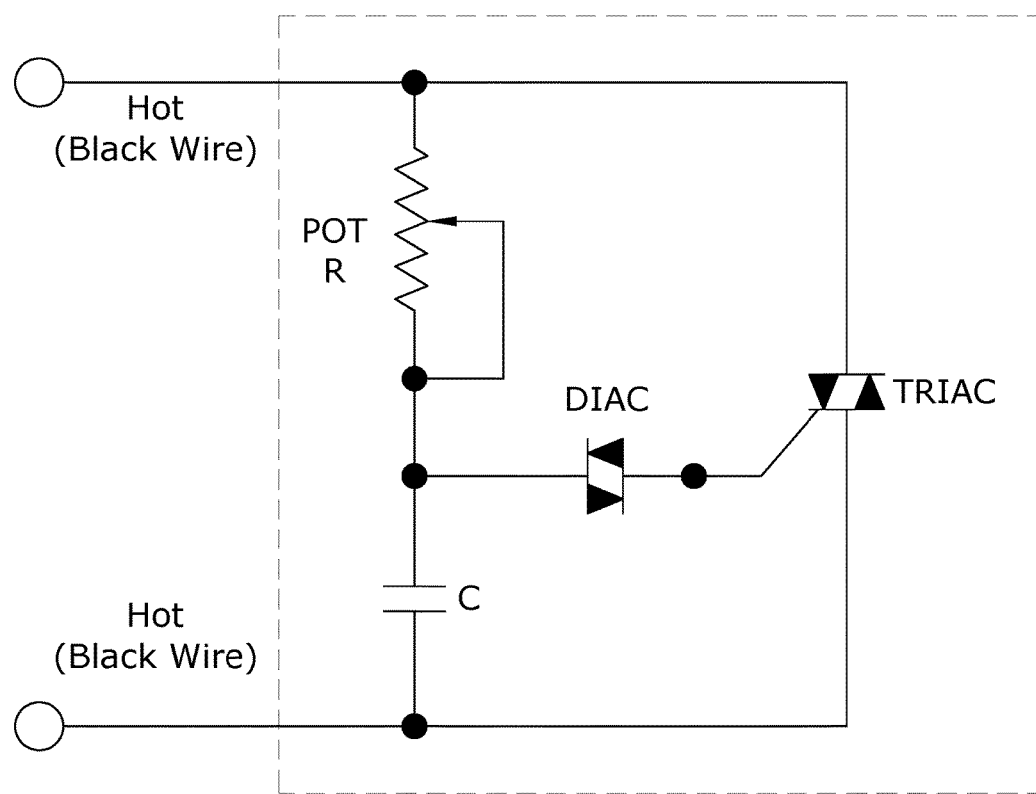
FIG. 11 is a schematic diagram of a basic TRIAC dimmer circuit.

FIG. 11 illustrates a basic TRIAC dimming circuit for a TRIAC dimmer 50 suitable for usage with the present invention. The potentiometer (POT R) and capacitor (C) combine to create a phase-shift network that is used to set the TRIAC conduction angle, thereby determining the amount of power applied to the AC electrical power load. The potentiometer is adjusted by the user as a slide, knob or button on the dimmer itself. As the capacitor is charged, it will exceed the DIAC's break over voltage, at which point the DIAC will begin to conduct electricity to the TRIAC's gate, triggering the TRIAC to conduct. Typical DIAC break over voltages range between 20V and 40V. As the potentiometer's resistance is decreased, the DIAC's break over voltage is achieved more readily, thus activating the TRIAC sooner. The faster the TRIAC conducts, the more power is delivered to the load (e.g. incandescent lights). Once activated, the TRIAC conducts electricity until the current drops below the TRIAC's holding current, typically on the order of 10's of milliamps. With this information, it can be shown that by applying a voltage greater than the DIAC's break over voltage across the TRIAC dimmer 50, the position (0% to 100%) of the potentiometer can be determined by measuring the amount of time required to charge the capacitor beyond the DIAC's break over voltage and activate the TRIAC. Due to the AC design of conventional TRIAC dimmers 50, the polarity of the applied voltage does not matter as illustrated in FIGS. 3 and 5 of the drawings.

Figure 3:
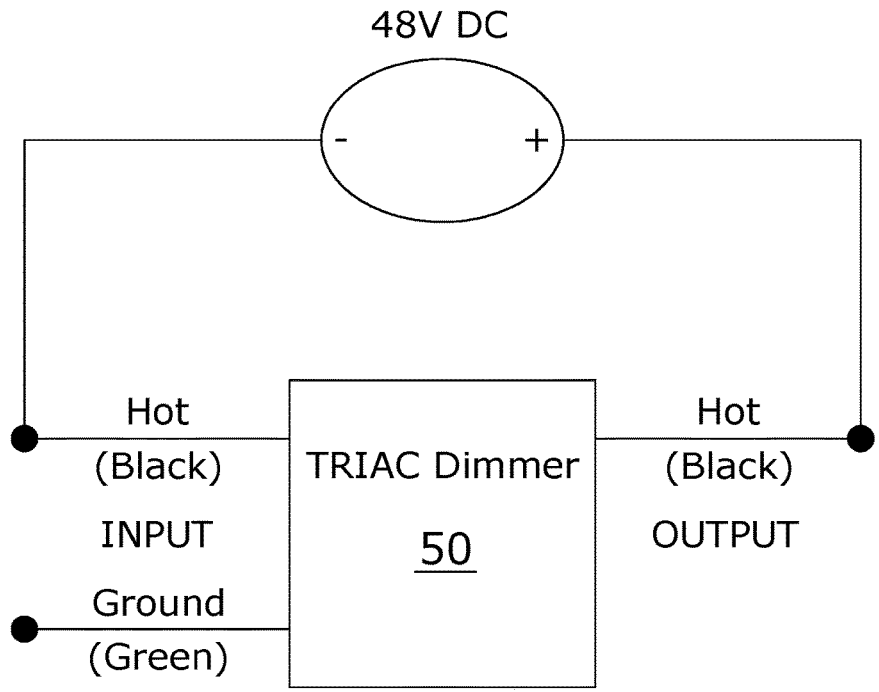
FIG. 3 is a block diagram illustrating a 48V DC test voltage applied to the TRIAC dimmer in a first polarity.
Figure 4:
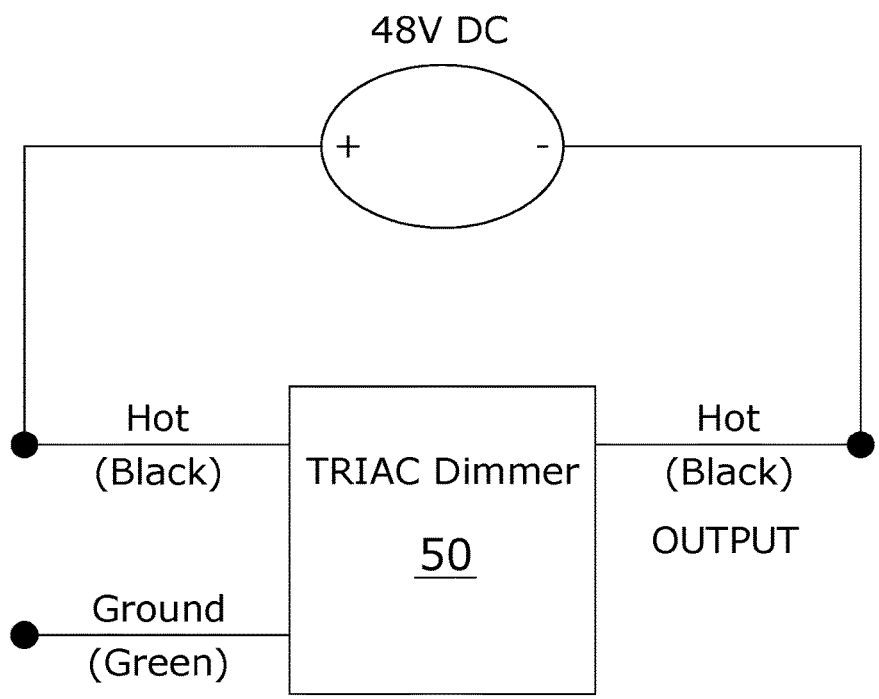
FIG. 4 is a block diagram illustrating a 48V DC test voltage applied to the TRIAC dimmer in a second polarity that is opposite of the first polarity.

The TRIAC dimmer 50 is comprised of a first main terminal and a second main terminal referenced as Hot, Black or Black Wire in FIGS. 3, 4 and 11 of the drawings. The first main terminal and the second main terminal are the electrical terminals of a conventional TRIAC dimmer 50 that are typically electrically connected with the AC power source (e.g. power line) electrically connected to the first main terminal and the load electrically connected to the second main terminal (of course in the present invention no such connection is used). The TRIAC dimmer 50 typically includes a ground terminal which is typically comprised of a green wire (referenced as Ground and Green in FIGS. 3-4 of the drawings). The ground terminal is utilized for grounding the TRIAC dimmer 50 in conventional AC applications. The ground terminal of the TRIAC dimmer 50 as used in the present invention may not be electrically connected to anything and may be insulated with electrical tape. It is preferable that the ground terminal of the TRIAC dimmer 50 not be connected to anything, but not required.

The analyzer 32 is electrically connected to the first main terminal and the second main terminal of the TRIAC dimmer 50 to apply the test voltage to the TRIAC dimmer 50 and to determine when the TRIAC dimmer 50 begins to conduct electricity. FIGS. 3 and 4 illustrate a test voltage of 48V DC applied to the TRIAC dimmer 50 at two different polarities.

E. Control Unit.

Figure 9:
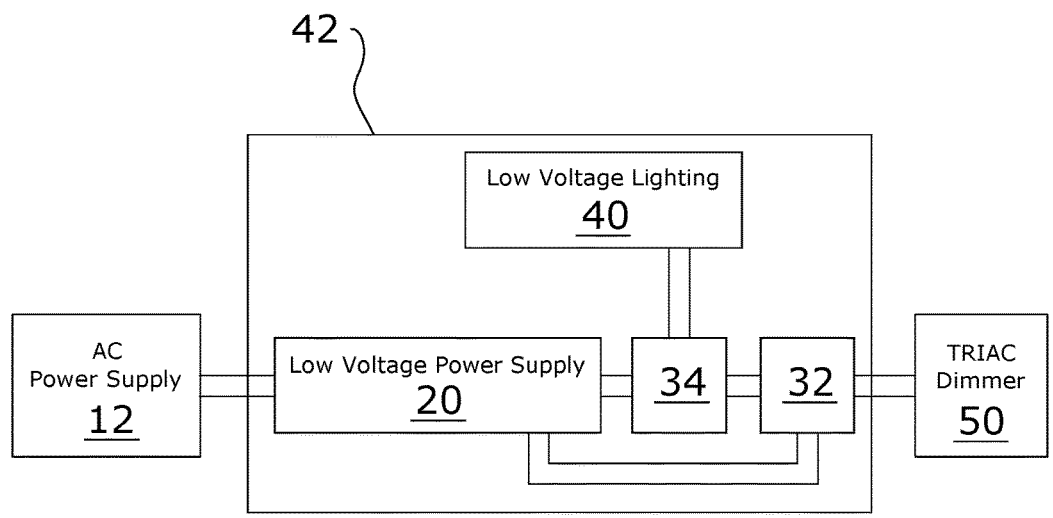
FIG. 9 is a block diagram illustrating the present invention embodied directly and integrally formed within the housing of low voltage lighting.

The control unit 30 is comprised of an electronic device capable of determining the state of the TRIAC dimmer 50 and dimming the low voltage lighting 40. The control unit 30 may be an individual standalone unit that is electrically connected to the TRIAC dimmer 50 and the low voltage lighting 40 as illustrated in FIGS. 1 and 2 of the drawings. Alternatively, the control unit 30 may be directly integrated within the housing 22 of the low voltage power supply 20 as illustrated in FIGS. 7 and 8 of the drawings. As another alternative, the control unit 30 may be directly integrated within the lighting fixture 42 of the low voltage lighting 40 as illustrated in FIG. 9 of the drawings. The control unit 30 preferably includes a microprocessor and is electrically connected to the low voltage power supply 20 and/or the AC power supply 12. The control unit 30 may be comprised of a computer capable of receiving, storing and transmitting data.

As illustrated in FIG. 2 of the drawings, the control unit 30 is comprised of a TRIAC analyzer 32 (referred to as only an analyzer 32 herein) that analyzes the state of the TRIAC dimmer 50 and a low voltage dimmer 34 that controls the luminosity of the low voltage lighting 40. The analyzer 32 communicates with the low voltage dimmer 34 to control the DC output voltage of the low voltage dimmer 34 thereby controlling the brightness level of the low voltage lighting 40. The communications between the analyzer 32 and the low voltage dimmer 34 may be unilateral from the analyzer 32 to the low voltage dimmer 34 via a control signal or bidirectional.

The analyzer 32 and the low voltage dimmer 34 are preferably integrated into a single device, however, the analyzer 32 and the low voltage dimmer 34 may be comprised of two completely separate devices. For example, the analyzer 32 may be comprised of a wireless device that is electrically connected to the TRIAC dimmer 50 and in wireless communication with the low voltage dimmer 34 which is in a different physical location to control the low voltage lighting 40. In addition, the analyzer 32 may also communicate (wirelessly or wired) with one, two or more low voltage dimmers 34 to control one or more systems of low voltage lighting 40.

F. Low Voltage Dimmer.

The low voltage dimmer 34 may be comprised of any convention dimmer capable of controlling the level of brightness of low voltage lighting 40. It is preferable that the low voltage dimmer 34 be comprised of an LED dimmer to control light emitted from LED based lighting such as a pulse-width modulation (PWM) LED dimmer or an analog LED dimmer. The low voltage dimmer 34 may be integrally part of the control unit 30 and/or the analyzer 32, or the low voltage dimmer 34 may be completely separate from them. The low voltage dimmer 34 may also be integrally formed with the low voltage power supply 20 as shown in FIG. 7 of the drawings or integrally formed with the lighting fixture 42 of the low voltage lighting 40 as illustrated in FIG. 9 of the drawings.

The low voltage dimmer 34 is in communication with the analyzer 32 either wired or wirelessly (e.g. WI-FI, BLUETOOTH based wireless technologies). The analyzer 32 transmits a control signal to the low voltage dimmer 34 specifying a DC output voltage for the low voltage dimmer 34 to correspondingly control the brightness level of the low voltage lighting 40. The DC output voltage may be comprised of pulse-width modulation (PWM) if using a PWM LED dimmer. The DC output voltage may be comprised of a voltage level control (e.g. 12V DC when the TRIAC dimmer 50 state is determined to be in a 100% power position, 6V DC when the TRIAC dimmer 50 state is determined to be in a 50% power position and 0V DC when the TRIAC dimmer 50 state is determined to be in a 0% power position). The DC output voltage may also be comprised of a current limiting functionality wherein the voltage of the DC output voltage remains the same (e.g. 12V DC) but the amount of current allowed to be provided is limited to the corresponding state of the TRIAC dimmer 50 (e.g. the maximum current is allowed when the TRIAC dimmer 50 state is determined to be in a 100% power position and no current is allowed when the TRIAC dimmer 50 state is determined to be in a 0% power position).

G. Analyzer.

The TRIAC analyzer 32 (referred to throughout as analyzer 32) is adapted to apply a test voltage to the TRIAC dimmer 50 and to measure a period of time required for the TRIAC dimmer 50 to start conducting electricity after applying the test voltage. The analyzer 32 calculates a state of the TRIAC dimmer 50 (e.g. position of the control switch) based upon the period of time required for the TRIAC dimmer 50 to start conducting electricity after applying the test voltage. In an alternative embodiment, the analyzer 32 determines that the TRIAC dimmer 50 is conducting electricity when the TRIAC dimmer 50 conducts a minimum electrical current when the test voltage is applied. Through testing, the applicant has determined that a preferred minimum electric current is comprised of at least 50 milliamps (mA), however, greater or less than 50 milliamps may be used for the minimum electrical current threshold. The analyzer 32 may be comprised of any electrical device capable of receiving, storing and/or transmitting data such as a computer. The analyzer 32 preferably includes a microprocessor that calculates the state of the TRIAC dimmer 50 along with other functions of the analyzer 32.

The analyzer 32 measures, calculates and determines what percentage the TRIAC dimmer 50 is set to by a user such as between 0% to 100% with 0% being low or no illumination and with 100% being full illumination of the low voltage lighting 40 and proportionally in between thereof. FIGS. 7 and 8 illustrate a sliding dimmer being used for the TRIAC dimmer 50 wherein the sliding control switch is approximately at 50% wherein the top of the sliding positions would be 100% and the bottom of the sliding positions would be 0%. The analyzer 32 calculates the state of the TRIAC dimmer 50 based upon the period of time measured from the start time of the analyzer 32 applying the test voltage to the end time of the TRIAC dimmer 50 conducting electrical current.

The test voltage applied by the analyzer 32 is preferably comprised of a DC voltage sufficient to cause the TRIAC dimmer 50 to conduct electrical current. The applicant has learned through testing that the test voltage should be greater than 30V DC (even though it could be less) and is further preferred that the test voltage is at least 48V DC to ensure an accurate and consistent period of time for the TRIAC dimmer 50 to start conducting is measured. The chart in FIG. 10 was developed testing five different positions of a conventional TRIAC dimmer 50 (LEVITON® SURESLIDE® 6672) to determine the period of time for the TRIAC dimmer 50 to start conducting at least 50 milliamps when the test voltage applied is 48V DC. As further shown in FIG. 10 of the drawings, the period of time for the TRIAC dimmer 50 to begin conducting 50 milliamps is approximately linear and is inversely proportional to the state of the TRIAC dimmer 50.

The analyzer 32 removes the test voltage for a discharge time from the TRIAC dimmer 50 after the TRIAC dimmer 50 starts to conduct electricity to allow the TRIAC dimmer 50 to discharge to ensure an accurate next measurement of the state of the TRIAC dimmer 50 by the analyzer 32. The discharge time is at least an amount of time sufficient to allow the capacitor C in the TRIAC dimmer 50 to discharge. The discharge time is preferably at least 50 milliseconds which the applicant has determined is a sufficient time to allow the TRIAC dimmer 50 to discharge, however, the discharge time may be greater than, less than or equal to 50 milliseconds.

The analyzer 32 again applies the test voltage after the discharge time. The process of applying the test voltage and removing the test voltage for a discharge time is repeated continuously to determine the current state of the TRIAC dimmer 50 for at least during a period of time when it is determined that low voltage DC electrical power is required by the low voltage lighting 40.

Figure 10:
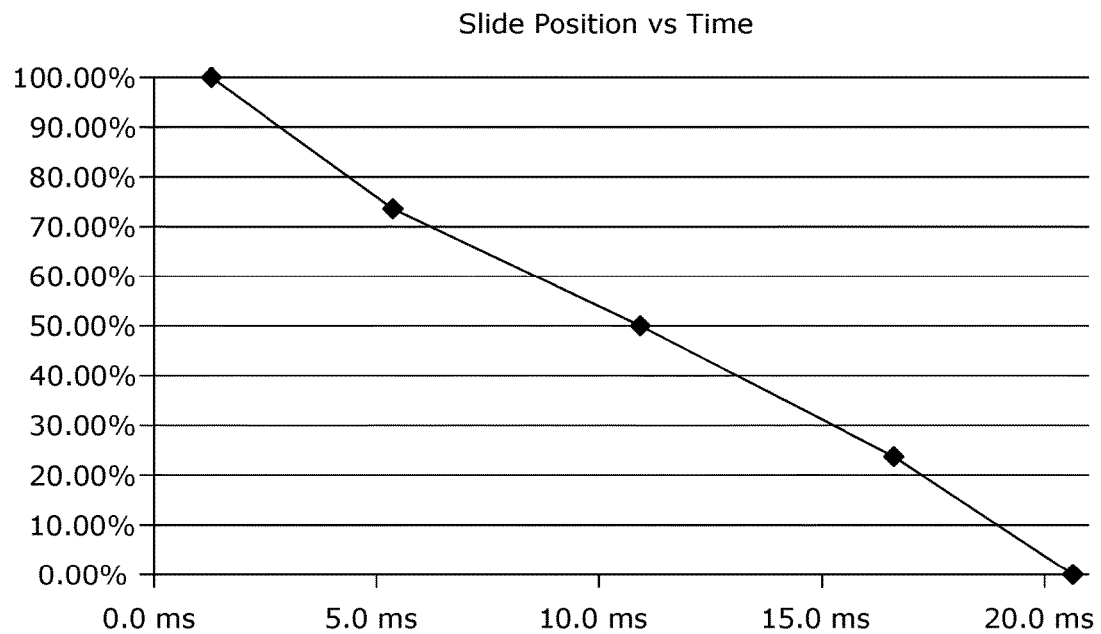
FIG. 10 is a chart illustrating the amount of time required for an exemplary TRIAC dimmer comprised of a LEVITON® SURESLIDE® 6672 to conduct current based upon the relative slide position (0% to 100%) of the TRIAC dimmer when 48V DC is applied to the TRIAC dimmer.

The state of the TRIAC dimmer 50 calculated by the analyzer 32 is comprised of an estimated dimming position for a dimming switch of the TRIAC dimmer 50. The estimated dimming position is calculated by the analyzer 32 based upon the period of time that the TRIAC dimmer 50 takes to conduct electrical current from the time the test voltage is applied. The analyzer 32 utilizes this state data to signal to the low voltage dimmer 34 the level of DC output voltage that should be applied to the low voltage lighting 40 to achieve a corresponding level of brightness from the low voltage lighting 40. The DC output voltage from the low voltage dimmer 34 is inversely proportional to the period of time it takes for the TRIAC dimmer 50 to conduct electricity as illustrated in FIG. 10 of the drawings.

The analyzer 32 may be in a wired or wireless communication with the low voltage dimmer 34. When in wireless communication with the low voltage dimmer 34, the analyzer 32 is able to be positioned in a location remote of the low voltage dimmer 34 such as adjacent to the TRIAC dimmer 50.

The analyzer 32 may initially be manufactured with a preset formula for determining the state/position of the TRIAC dimmer 50. The analyzer 32 may also learn the state/position of the TRIAC dimmer 50 over time by monitoring the lowest recorded period of time to conduct a minimum level of electrical current (i.e. this would be the highest state where the luminosity should be 100% for the low voltage lighting 40) and the highest recorded period of time to conduct a minimum level of electrical current (i.e. this would be the lowest state where the luminosity should be 0% for the low voltage lighting 40). The analyzer 32 can do a linear approximation of the period of time between the recorded highest state and lowest state to provide accurate control over the low voltage lighting 40 over a period of time. The ability of the analyzer 32 to learn the different periods of time to conduct electricity for the TRIAC dimmer 50 allows the analyzer 32 to be used with various types and brands of TRIAC dimmers 50. In addition, the ability to learn the different periods of time to conduct electricity for the TRIAC dimmer 50 allows the analyzer 32 to automatically adjust based upon the characteristics of the TRIAC dimmer 50 changing over time.

Figure 12:
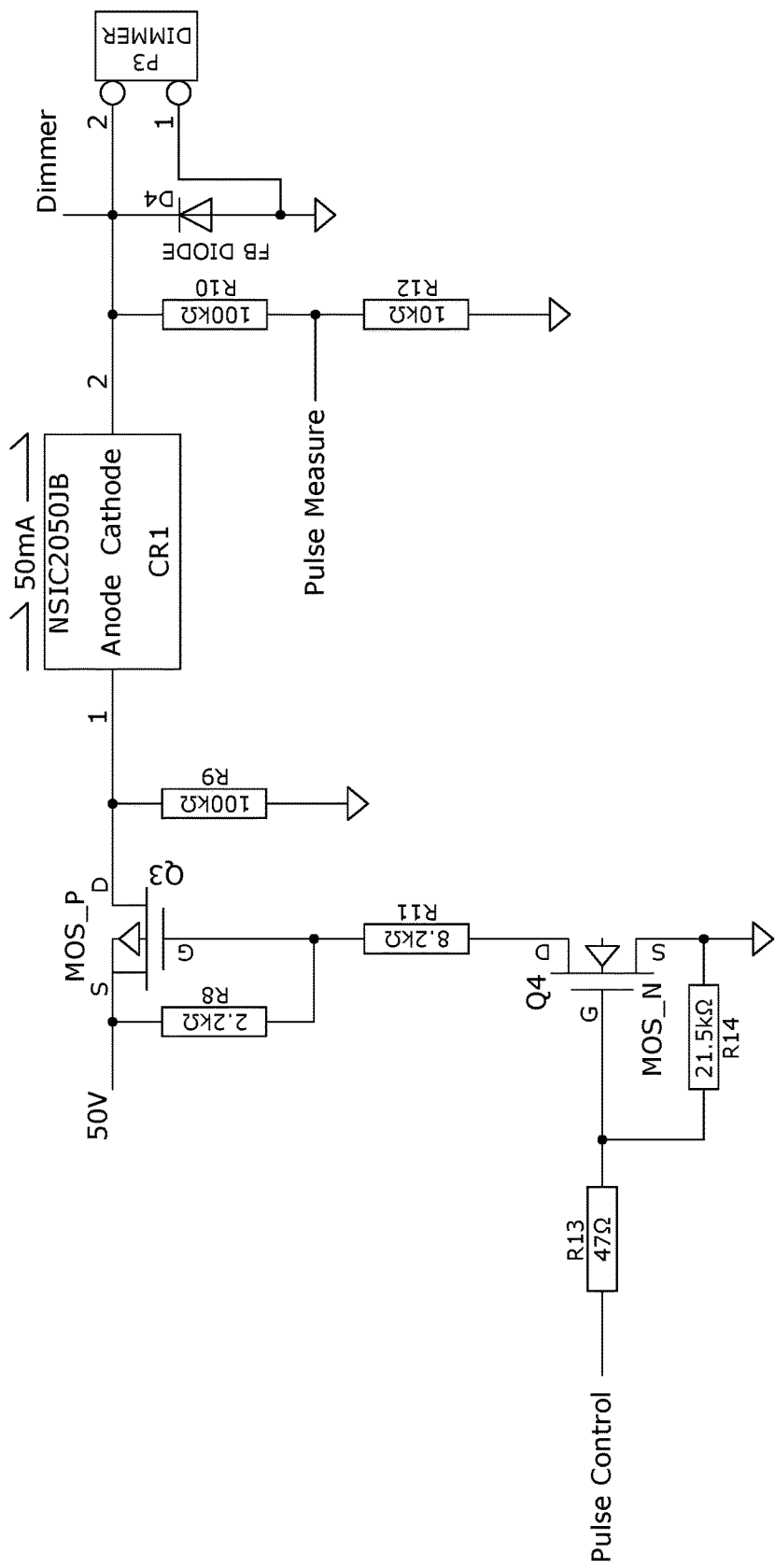
FIG. 12 is a schematic diagram illustrating a circuit used by the microcontroller in the TRIAC analyzer to determine the state of the TRIAC dimmer.

FIG. 12 illustrates a circuit used by the microcontroller in the analyzer 32 to control the entire process of the analyzer 32. The microcontroller controls the 48V line to the TRIAC dimmer 50 by applying 5V to PulseControl. 48V DC then travels through the 50 mA constant current regulator and to the TRIAC dimmer 50. The microcontroller then monitors the PulseMeasure, which will drop to 0V as soon as the TRIAC dimmer 50 starts conducting electricity. Once this change is detected, the PulseControl is pulled back down to 0V, effectively turning off the 48V line. The time is recorded and the system is then adjusted accordingly at which point the process starts over again.

H. Operation of Preferred Embodiment.

In use, a test voltage (e.g. 48V DC) is applied to the first main terminal and the second main terminal of a TRIAC dimmer 50. A small amount of electrical current will initially be conducted by the TRIAC dimmer 50 to charge the capacitor C in the TRIAC dimmer 50.

After the capacitor C in the TRIAC dimmer 50 is charged, the TRIAC dimmer 50 will then start conducting a minimum electrical current (e.g. 20 mA or more). The charge on FIG. 10 utilizes 50 mA as a minimum electric current while greater or less minimum electrical currents may be used.

After the analyzer 32 determines that a minimum electrical current is being conducted by the TRIAC dimmer 50, the analyzer 32 identifies the end time thereby allowing for the measure of the period of time between the start time and the end time. In addition, the TRIAC dimmer 50 removes the test voltage at the end time or shortly thereafter to allow the TRIAC dimmer 50 to discharge. The analyzer 32 calculates the current state of the TRIAC dimmer 50 based upon the period of time measured for the TRIAC dimmer 50 to conduct a minimum electrical current.

As shown in FIG. 10, the greater the period of time measured by the analyzer 32 the lower the state of the TRIAC dimmer 50 is estimated to be positioned at. In addition, the lower the period of time measured by the analyzer 32 the greater the state of the TRIAC dimmer 50 is estimated to be positioned at. Based upon the period of time, the analyzer 32 is able to calculate the illumination level that the low voltage lighting 40 should be at and communicate the illumination data to the low voltage dimmer 34 so that the DC output voltage from the low voltage dimmer 34 may be adjusted accordingly to corresponding to the illumination level (and to the state of the TRIAC dimmer 50). The illumination level of the low voltage lighting 40 is inversely proportional to the period of time measured by the analyzer 32.

After the discharge time, the analyzer 32 repeats the process of applying the test voltage, determining the period of time when the TRIAC dimmer 50 starts to conduct electrical current at a minimum level, measuring the period of time, removing the test voltage and adjusting the DC output voltage of the low voltage dimmer 34 accordingly. If there was no change in state of the TRIAC dimmer 50 compared to the prior measured state of the TRIAC dimmer 50, then the low voltage dimmer 34 maintains the same level of DC output voltage. If the state of the TRIAC dimmer 50 is determined to have been lowered by the analyzer 32 from the prior measured state, then the analyzer 32 instructs the low voltage dimmer 34 to correspondingly decrease the low voltage lighting 40 by lowering the DC output voltage which lowers the luminosity of the low voltage lighting 40. If the state of the TRIAC dimmer 50 is determined to have been increased by the analyzer 32 from the prior measured state, then the analyzer 32 instructs the low voltage dimmer 34 to correspondingly increase the low voltage lighting 40 by increasing the DC output voltage which correspondingly increases the luminosity of the low voltage lighting 40. As discussed previously, the DC output voltage may be adjusted using PWM or analog for LED based lighting.

Unless otherwise defined, all technical and scientific terms used herein have the same meaning as commonly understood by one of ordinary skill in the art to which this invention belongs. Although methods and materials similar to or equivalent to those described herein can be used in the practice or testing of the present invention, suitable methods and materials are described above. All publications, patent applications, patents, and other references mentioned herein are incorporated by reference in their entirety to the extent allowed by applicable law and regulations. The present invention may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

The invention claimed is:

1. A low voltage dimmer, comprising:
   an analyzer adapted to apply a test voltage to a TRIAC dimmer and to measure a period of time required for said TRIAC dimmer to start conducting electricity after applying said test voltage, wherein said analyzer calculates a state of said TRIAC dimmer based upon said period of time, and wherein said test voltage is comprised of a direct current (DC) voltage; and
   a low voltage dimmer in communication with said analyzer, wherein said analyzer transmits a signal to said low voltage dimmer specifying a DC output voltage for said low voltage dimmer.

2. The light dimming control system of claim 1, wherein said test voltage is greater than 30V DC.

3. The light dimming control system of claim 2, wherein said test voltage is at least 48V DC.

4. The light dimming control system of claim 2, wherein said test voltage is approximately 48V DC.

5. The light dimming control system of claim 1, wherein said analyzer removes said test voltage from said TRIAC dimmer after said TRIAC dimmer starts to conduct electricity.

6. The light dimming control system of claim 1, wherein said analyzer removes said test voltage from said TRIAC dimmer for a discharge time after said TRIAC dimmer starts to conduct electricity.

7. The light dimming control system of claim 6, wherein said discharge time is at least an amount of time sufficient to allow a capacitor in said TRIAC dimmer to discharge.

8. The light dimming control system of claim 6, wherein said analyzer again applies said test voltage after said discharge time.

9. The light dimming control system of claim 6, wherein said discharge time is at least 50 milliseconds.

10. The light dimming control system of claim 1, wherein said analyzer determines that said TRIAC dimmer is conducting electricity when said TRIAC dimmer conducts a minimum electric current when said test voltage is applied.

11. The light dimming control system of claim 10, wherein said minimum electric current is comprised of at least 50 milliamps (mA).

12. The light dimming control system of claim 1, wherein said low voltage lighting is comprised of at least one light emitting diode (LED).

13. The light dimming control system of claim 12, wherein said low voltage dimmer is adapted to be electrically connected to a low voltage lighting.

14. The light dimming control system of claim 1, wherein said TRIAC dimmer is comprised of a first main terminal, a second main terminal and a ground terminal, wherein said analyzer is electrically connected to said first main terminal and said second main terminal of said TRIAC dimmer.

15. The light dimming control system of claim 14, wherein said ground terminal of said TRIAC dimmer is not electrically connected to anything.

16. The light dimming control system of claim 1, wherein said state of said TRIAC dimmer calculated by said analyzer is comprised of an estimated dimming position for a dimming switch of said TRIAC dimmer, wherein said estimated dimming position is calculated by said analyzer based upon said period of time.

17. The light dimming control system of claim 16, wherein said DC output voltage of said low voltage dimmer is inversely proportional to said period of time.

18. The light dimming control system of claim 1, wherein said analyzer is in wireless communication with said low voltage dimmer.

19. A TRIAC dimmer analyzer, comprising:
   an analyzer adapted to apply a test voltage to said TRIAC dimmer and to measure a period of time required for said TRIAC dimmer to start conducting electricity after applying said test voltage, wherein said analyzer calculates a state of said TRIAC dimmer based upon said period of time, and wherein said test voltage is comprised of a direct current (DC) voltage.

20. A method of calculating an illumination level based upon a state of a TRIAC dimmer, comprising the steps of:
providing a control unit comprised of an analyzer and a low voltage dimmer, wherein said low voltage dimmer is adapted to electrically connect to a low voltage lighting and provide a DC output voltage to said low voltage lighting at different levels to dim said low voltage lighting;
applying a test voltage to a first main terminal and a second main terminal of a TRIAC dimmer, wherein said test voltage is comprised of a DC voltage of at least 30V DC;
determining a period of time for said TRIAC dimmer to conduct a minimum electric current; and
calculating an illumination level based at least on said period of time.

* * * * *